United States Patent
Lee et al.

(10) Patent No.: US 8,785,937 B2
(45) Date of Patent: Jul. 22, 2014

(54) ORGANIC LIGHT-EMITTING DISPLAY APPARATUS AND METHOD OF MANUFACTURING THE SAME

(75) Inventors: June-Woo Lee, Yongin (KR); Joon-Hoo Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 95 days.

(21) Appl. No.: 13/244,174

(22) Filed: Sep. 23, 2011

(65) Prior Publication Data

US 2012/0146033 A1      Jun. 14, 2012

(30) Foreign Application Priority Data

Dec. 14, 2010 (KR) .................. 10-2010-0127859

(51) Int. Cl.
| | | |
|---|---|---|
| H01L 29/04 | (2006.01) | |
| H01L 29/10 | (2006.01) | |
| H01L 27/12 | (2006.01) | |
| H01L 29/49 | (2006.01) | |
| H01L 29/66 | (2006.01) | |
| G02F 1/1362 | (2006.01) | |

(52) U.S. Cl.
CPC ............. *H01L 27/12* (2013.01); *H01L 27/1214* (2013.01); *H01L 29/4908* (2013.01); *H01L 29/66765* (2013.01); *G02F 1/136227* (2013.01)
USPC ............................................. 257/59; 257/72

(58) Field of Classification Search
CPC ............ H01L 27/1244; H01L 27/3244; H01L 51/5237; H01L 51/5253
USPC .............................................. 257/40, 59, 72
See application file for complete search history.

(56) References Cited

U.S. PATENT DOCUMENTS

| | | | |
|---|---|---|---|
| 8,445,915 B2 * | 5/2013 | You ................................ | 257/72 |
| 2006/0001091 A1 * | 1/2006 | Kim .............................. | 257/347 |
| 2006/0113900 A1 | 6/2006 | Oh | |
| 2006/0125390 A1 | 6/2006 | Oh | |
| 2007/0002201 A1 * | 1/2007 | You ................................ | 349/43 |
| 2010/0193790 A1 * | 8/2010 | Yeo et al. ........................ | 257/59 |
| 2011/0115090 A1 * | 5/2011 | Lin ............................... | 257/750 |

FOREIGN PATENT DOCUMENTS

| | | |
|---|---|---|
| JP | 2006-156374 | 6/2006 |
| KR | 10-2004-0037889 | 5/2004 |
| KR | 10-2006-0067049 | 6/2006 |
| KR | 10-2010-0004662 | 1/2010 |

OTHER PUBLICATIONS

English Machine transition of KR 1020040037889A.*

* cited by examiner

*Primary Examiner* — Anthony Ho
(74) *Attorney, Agent, or Firm* — Robert E. Bushnell, Esq.

(57) ABSTRACT

An organic light-emitting display apparatus that includes a thin film transistor comprising an active layer, a gate electrode, and source and drain electrodes electrically connected to the active layer; a pixel electrode formed on the same layer as the gate electrode; a light-emitting layer formed on the pixel electrode; a passivation layer formed on upper surfaces of the source and drain electrodes and upper surfaces of wirings formed on the same layer as the source and drain electrodes; an organic insulating layer that covers the thin film transistor, comprises an opening that exposes an upper surface of the pixel electrode, and directly contacts the passivation layer; and a facing electrode that is formed on the light-emitting layer, and is formed to directly contact the organic insulating layer to face the pixel electrode.

18 Claims, 6 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 14 Dec. 2010 and there duly assigned Serial No. 10-2010-0127859.

BACKGROUND OF THE INVENTION

1. Field of the Invention

The present invention relates to an organic light-emitting display apparatus and a method of manufacturing the same.

2. Description of the Related Art

Organic light-emitting display apparatuses have received considerable attention as the next generation display apparatuses due to their superior characteristics, such as wide viewing angles, short response times, and low power consumption, as well as that they can be designed to be thin and lightweight.

SUMMARY OF THE INVENTION

The present invention provides an organic light-emitting display apparatus that can be manufactured by a simple process and prevents disconnections between a facing electrode and wirings, and a method of manufacturing the same.

According to an aspect of the present invention, there is provided an organic light-emitting display apparatus including: a thin film transistor comprising an active layer, a gate electrode, and source and drain electrodes electrically connected to the active layer; a pixel electrode formed on the same layer as the gate electrode; a light-emitting layer formed on the pixel electrode; a passivation layer formed on upper surfaces of the source and drain electrodes and upper surfaces of wirings formed on the same layer as the source and drain electrodes; an organic insulating layer that covers the thin film transistor, comprises an opening that exposes an upper surface of the pixel electrode, and is formed to directly contact the passivation layer; and a facing electrode that is formed on the light-emitting layer, and is formed to directly contact the organic insulating layer to face the pixel electrode.

Edge sides of the passivation layer may have the same etching surfaces as edge sides of the source and drain electrodes and the wirings.

The organic insulating layer may directly contact the edge sides of the passivation layer.

The passivation layer may be formed of an inorganic insulating material, or an organic insulating material.

The wiring may be a data line or a power supply line.

The organic light-emitting display apparatus may further include a first insulating layer disposed between the active layer and the gate electrode, and a second insulating layer formed between the gate electrode and the source and drain electrodes, wherein one of the source and drain electrodes is connected to the pixel electrode through a contact hole formed in the second insulating layer.

The pixel electrode may include the same transparent conductive material as the gate electrode.

The facing electrode may be a reflection electrode.

The organic light-emitting display apparatus may further include a lower electrode formed on the same layer as the active layer and a capacitor having an upper electrode formed on the same layer as the first gate electrode.

The organic insulating layer may be formed directly on the upper electrode.

The lower electrode may include a semiconductor doped with an ion dopant.

The upper electrode may include the same transparent conductive material as the gate electrode.

The transparent conductive material may be at least one selected from the group consisting of ITO, IZO, ZnO, and $In_2O_3$.

According to an aspect of the present invention, there is provided a method of manufacturing an organic light-emitting display apparatus, the method including: performing a first mask process for forming a semiconductor layer on a substrate and for forming an active layer of a thin film transistor by patterning the semiconductor layer; performing a second mask process for forming a first insulating layer on the resultant structure of the first mask process, and for forming a gate electrode of the thin film transistor and the pixel electrode of the pixel unit by patterning a transparent conductive material layer and a first metal layer after sequentially forming the transparent conductive material layer and the metal layer on the first insulating layer; performing a third mask process for forming a second insulating layer on the resultant structure of the second mask process, and for forming contact holes that expose source and drain regions of the active layer and the pixel electrode; performing a fourth mask process for sequentially forming a second metal layer and a passivation layer on the resultant structure of the third mask process, and for forming source and drain electrodes connected to the active layer and wirings formed on the same layer as the source and drain electrodes by patterning the second metal layer and the passivation layer; and performing a fifth mask process for forming a third insulating layer on the structure product of the fourth mask process, and opening the third insulating layer to expose the transparent conductive material of the pixel electrode.

The method may further include doping the source and drain electrodes with an ion dopant after performing the second mask process.

The fourth mask process may include: a first etching process for removing a portion of the passivation layer; a second etching process for removing the second metal layer stacked on the pixel electrode; and a third etching process for removing the first metal layer formed on the transparent conductive material layer of the pixel electrode.

The first etching process may be a dry etching process.

The fourth mask process may include forming the first and second metal layer using the same material, and simultaneously etching the first and second metal layers after performing the first etching process for removing a portion of the passivation layer.

The method may further include forming a lower electrode of the capacitor in the first mask process, forming an upper electrode of the capacitor in the second mask process, forming a contact hole for exposing the upper electrode in the third mask process, and removing a portion of the upper electrode in the fourth mask process.

The method may further include doping the lower electrode of the capacitor with an ion dopant after performing the fourth mask process.

The method may further include forming a light-emitting layer and a facing electrode on the pixel electrode after performing the fifth mask process.

The organic light-emitting display apparatus and a method of manufacturing the same according to the present invention provides the following advantages.

First, since a passivation layer is formed on source and drain electrodes or wirings formed on the same layer as the source and drain electrodes, a short that can be caused between a facing electrode and the source and drain electrodes and wirings.

Second, the organic light-emitting display apparatus described above can be manufactured through five mask processes without an additional mask process.

Third, since the passivation layer is formed after forming the source and drain electrodes, the damage to the pixel electrode can be prevented.

Fourth, since the organic light-emitting display apparatus has a MIM CAP structure, the margin for designing a voltage can be increased.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
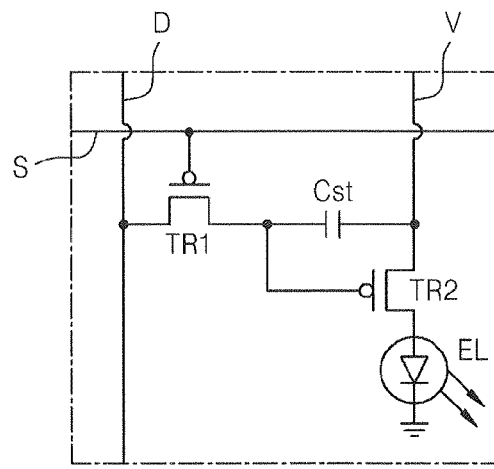
FIG. 1 is a circuit diagram of a pixel included in an organic light-emitting display apparatus according to an embodiment of the present invention.
Figure 2:
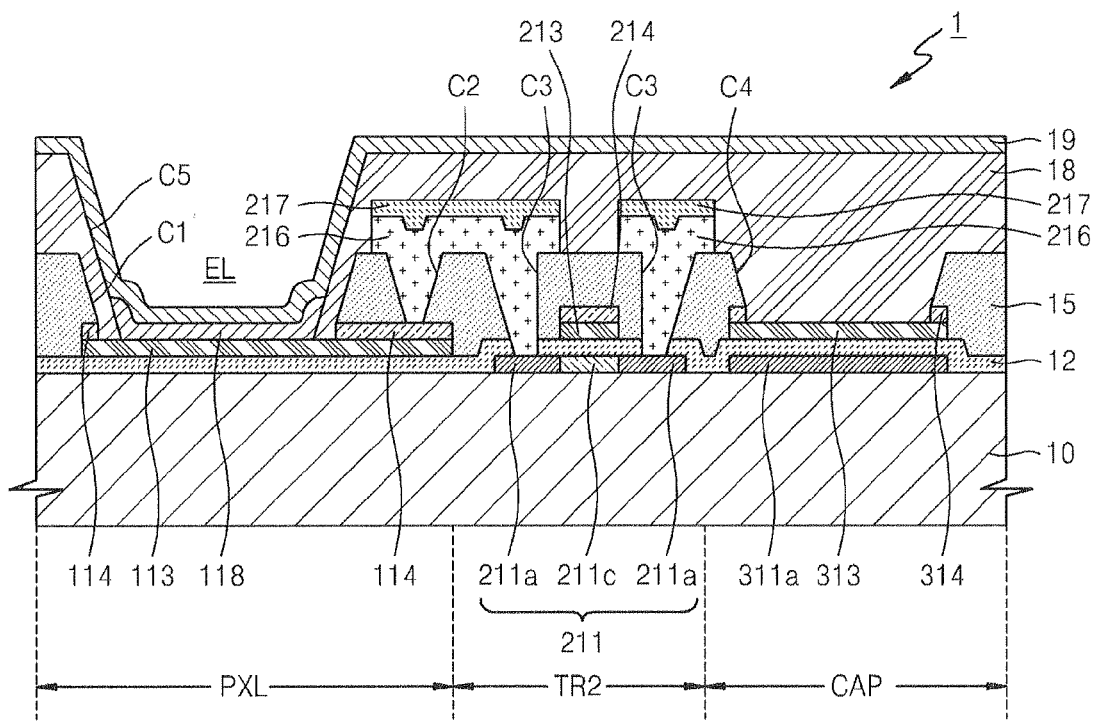
FIG. 2 is a schematic cross-sectional view of a portion of an organic light-emitting display apparatus according to an embodiment of the present invention.

FIG. 1 is a circuit diagram of a pixel included in an organic light-emitting display apparatus 1 according to an embodiment of the present invention. FIG. 2 is a schematic cross-sectional view of a portion of the organic light-emitting display apparatus 1 according to an embodiment of the present invention.

Referring to FIG. 1, the pixel of the organic light-emitting display apparatus 1 according to the current embodiment of the present invention includes a plurality of conductive lines such as a scan line S, a data line D, and a power supply line V, a light-emitting unit EL, first and second thin film transistors TR1 and TR2, and a capacitor Cst.

The circuit of FIG. 1 is an example circuit for explaining the current embodiment, and thus, a circuit according the present invention is not limited thereto. That is, the circuit according to the present invention may further include conductive lines besides the conductive lines depicted in FIG. 1. Also, the number of thin film transistors and capacitors are not limited to the number shown in FIG. 1, and at least two thin film transistors and at least one capacitor may be combined according to the pixel unit.

A gate electrode of the first thin film transistor TR1 is connected to the scan line S, and a first electrode of the first thin film transistor TR1 is connected to the data line D. A gate electrode of the second thin film transistor TR2 is connected to a second electrode of the first thin film transistor TR1, a first electrode of the second thin film transistor TR2 is connected to the power supply line V, and a second electrode of the second thin film transistor TR2 is connected to the light-emitting unit EL. Here, the first thin film transistor TR1 is a switching transistor, and the second thin film transistor TR2 is a driving transistor. In FIG. 1, the first and second thin film transistors TR1 and TR2 are depicted as P-type transistors. However, the present invention is not limited thereto, and at least one of the first and second thin film transistors TR1 and TR2 may be formed as an N-type transistor.

The capacitor Cst is connected between the second electrode of the first thin film transistor TR1 and the power supply line V. The capacitor Cst is a storage capacitor that stores a data signal while the data signal is applied to the first thin film transistor TR1.

Referring to FIG. 2, the second thin film transistor TR2 includes an active layer 211, first and second gate electrodes 213 and 214, and source and drain electrodes 216 formed on a substrate 10. In FIG. 2, a cross-sectional view of the second thin film transistor TR2 is depicted. However, the first thin film transistor TR1 may have a cross-section that is the same as that of the second thin film transistor TR2.

The substrate 10 may be formed of various materials such as glass or plastic. However, in the case of a bottom emission type display apparatus in which an image is displayed on the substrate 10, the substrate 10 may be formed of a transparent material.

Although not shown, a buffer layer (not shown) may further be formed on the substrate 10 in order to provide a flat surface above the substrate 10 and to block the penetration of foreign elements through an upper surface of the substrate 10. The buffer layer may be formed of $SiO_2$ and/or SiNx.

The active layer 211 may include amorphous silicon or polysilicon, and includes a channel region 211c and source and drain regions 211a formed by doping an ion dopant outside the channel region 211c. The source and drain regions 211a are formed as p-type semiconductors by doping with a Group III element and as n-type semiconductors by doping with a Group V element.

The first and second gate electrodes 213 and 214 are sequentially formed on the active layer 211 on a position corresponding to the channel region 211c of the active layer 211, with a first insulating layer 12 therebetween, wherein the first insulating layer 12 is a gate insulating film between the first gate electrode 213 and the active layer 211.

The first insulating layer 12 insulates the active layer 211 from the first and second gate electrodes 213 and 214, and may be formed of an inorganic material such as SiNx and/or $SiO_2$.

The first and second gate electrodes 213 and 214 may be formed of materials having etching selectivity different from each other. For example, the first and second gate electrodes 213 and 214 may be formed of at least one material selected from the group consisting of a transparent material such as indium tin oxide (ITO), Ti, Mo, Al, Ag, Cu, and an alloy of these materials having etching selectivity different from each other. In the current embodiment, the first gate electrode 213 is formed of ITO, which is a transparent conductive material, and the second gate electrode 214 is formed of triple layers of Mo/Al/Mo. The transparent conductive material for forming the first gate electrode 213 may be selected from the group consisting of indium zinc oxide (IZO), zinc oxide (ZnO), and indium oxide (In$_2$O$_3$).

A second insulating layer 15 is formed on the first and second gate electrodes 213 and 214. The second insulating layer 15 functions as an interlayer insulating film that insulates the first and second gate electrodes 213 and 214 from the source and drain electrodes 216.

The second insulating layer 15 may be formed of various insulating materials, for example, an inorganic insulating material such as an oxide, a nitride, or an organic material. The inorganic insulating material for forming the second insulating layer 15 includes SiO$_2$, SiNx, SiON, Al$_2$O$_3$, TiO$_2$, Ta$_2$O$_5$, HfO$_2$, ZrO$_2$, BST, and PZT, and the organic insulating material includes a widely used polymer such as poly(methyl methacrylate) (PMMA) and polystyrene (PS), a polymer derivative having a phenol group, an acrylic group polymer, an imide group polymer, an aryl ester group polymer, an amide group polymer, a fluoride group polymer, p-gilyrene group polymer, or a vinyl alcohol group polymer, and a blend of these polymers. Also, the second insulating layer 15 may be formed of a composite stack layer of inorganic and organic insulating layers.

The source and drain electrodes 216 both penetrate the second insulating layer 15 and the first insulating layer 12 and respectively contact the source and drain regions 211a of the active layer 211 through contact holes C3. In FIG. 2, the source and drain electrodes 216 are depicted as a single layer. However, the present invention is not limited thereto, and the source and drain electrodes 216 may be formed of a plurality of layers.

A passivation layer 217 is formed on the source and drain electrodes 216. Although not shown in FIG. 2, the passivation layer 217 may be formed on wirings formed on the same plane as the source and drain electrodes 216. For example, the wirings may be the data line D (refer to FIG. 1) or the power supply line V (refer to FIG. 1) formed on the same layer as the source and drain electrodes 216.

Since the passivation layer 217 is patterned with the same photomask in the same mask process as the source and drain electrodes 216, which will be described below, edge sides of the passivation layer 217 and edge sides of the source and drain electrodes 216 have the same etching surfaces.

A pixel unit PXL is formed on the substrate 10. The pixel unit PXL includes a first pixel electrode 113, a light-emitting layer 118, and a facing electrode 19.

The first pixel electrode 113 is formed on the same layer as the first gate electrode 213, and is formed of the same transparent conductive material as the first gate electrode 213. The transparent conductive material may be at least one selected from the group consisting of ITO, IZO, ZnO, In$_2$O$_3$, indium gallium oxide (IGO), and aluminum zinc oxide (AZO).

The light-emitting layer 118 is formed on the first pixel electrode 113, and light produced from the light-emitting layer 118 is emitted towards the substrate 10 through the first pixel electrode 113 formed of a transparent conductive material.

A third insulating layer 18 is formed on the first insulating layer 12 and the first pixel electrode 113. An opening C5 that exposes a second pixel electrode 114 is formed in the third insulating layer 18 that functions as a pixel-defining layer. The light-emitting layer 118 is in the opening C5.

The light-emitting layer 118 may be a low-molecular weight organic material layer or a polymer layer. When the light-emitting layer 118 is a low-molecular weight layer, a hole injection layer (HIL), a hole transport layer (HTL), an electron transport layer (ETL), and an electron injection layer (EIL) may be stacked around the light-emitting layer 118. Besides the layers above, various layers may be stacked as necessary. The organic materials that can be used include copper phthalocyanine (CuPc), N'-Di(naphthalene-1-yl)-N, N'-diphenyl-benzidine (NPB), or tris-8-hydroxyquinoline aluminum (Alq3).

If the light-emitting layer 118 is a polymer organic material layer, an HTL may be included besides the light emitting layer 118. The HTL can be formed of poly-(2,4)-ethylene-dihydroxy thiophene (PEDOT) or polyaniline (PANI). The polymer organic materials that can be used include poly(p-phenylene vinylene) (PPV), and polyfluorene.

The facing electrode 19 as a common electrode is deposited on the light-emitting layer 118. In the organic light-emitting display apparatus 1 according to the current embodiment of the present invention, the first pixel electrode 113 functions as an anode electrode, and the facing electrode 19 functions as a cathode electrode. However, the polarities of the first pixel electrode 113 and the facing electrode 19 may be reversed.

The facing electrode 19 may be formed as a reflection electrode that includes a reflection material. Here, the facing electrode 19 may include at least one material selected from the group consisting of Al, Mg, Li, Ca, LiF/Ca, and LiF/A. Since the facing electrode 19 is a reflection electrode, light emitted from the light-emitting layer 118 is reflected by the facing electrode 19, and is emitted towards the substrate 10 through the first pixel electrode 113 formed of a transparent conductive material.

The capacitor Cst is included on the substrate 10. A lower electrode 311a of the capacitor Cst is formed of the same material used to form the active layer 211c of the thin film transistor. A first upper electrode 313 of the capacitor Cst is formed of a transparent conductive material used to form the first gate electrode 213. In particular, the lower electrode 311a of the capacitor Cst is formed of a semiconductor material doped with an ion dopant, and thus, together with the first upper electrode 313, forms a metal-insulator-metal (MIM) CAP structure.

The MIM CAP structure generally can maintain a constant capacity of static electricity in a wide-voltage range when compared to a metal-oxide-semiconductor (MOS) CAP. Thus, the margin for designing a voltage can be increased when a circuit is designed.

The organic light-emitting display apparatus 1 according to the current embodiment of the present invention includes the third insulating layer 18 to completely cover the second thin film transistor TR2 and the capacitor Cst, which are described above, and to expose an upper surface of the first pixel electrode 113 of the pixel unit PXL.

The third insulating layer 18 functions as a pixel-defining layer formed to a predetermined thickness on an edge of the first pixel electrode 113, and may be formed of an organic insulating material. The organic insulating material may be a widely used polymer such as PMMA and PS, a polymer derivative having a phenol group, an acrylic group polymer, an imide group polymer, an aryl ester group polymer, an amide group polymer, a fluoride group polymer, p-gilyrene group polymer, or a vinyl alcohol group polymer, and a blend of these polymers.

In a process of manufacturing the organic light-emitting display apparatus 1, the third insulating layer 18 is formed on the uppermost layer of the substrate 10 before forming the light-emitting layer 118 on the first pixel electrode 113. In a manufacturing process, if holes or pinholes occur in the third insulating layer 18 due to particles, the source and drain electrodes 216 located below the third insulating layer 18 and the wirings formed on the same layer as the source and drain electrodes 216 may be directly exposed to the outside. Despite of the holes, when the facing electrode 19, which is a common electrode, is formed on the third insulating layer 18 after forming the light-emitting layer 118 on the first pixel electrode 113, a faulty product may be formed since a short can occur between the source and drain electrodes 216 or the wirings and the facing electrode 19.

Figure 3:
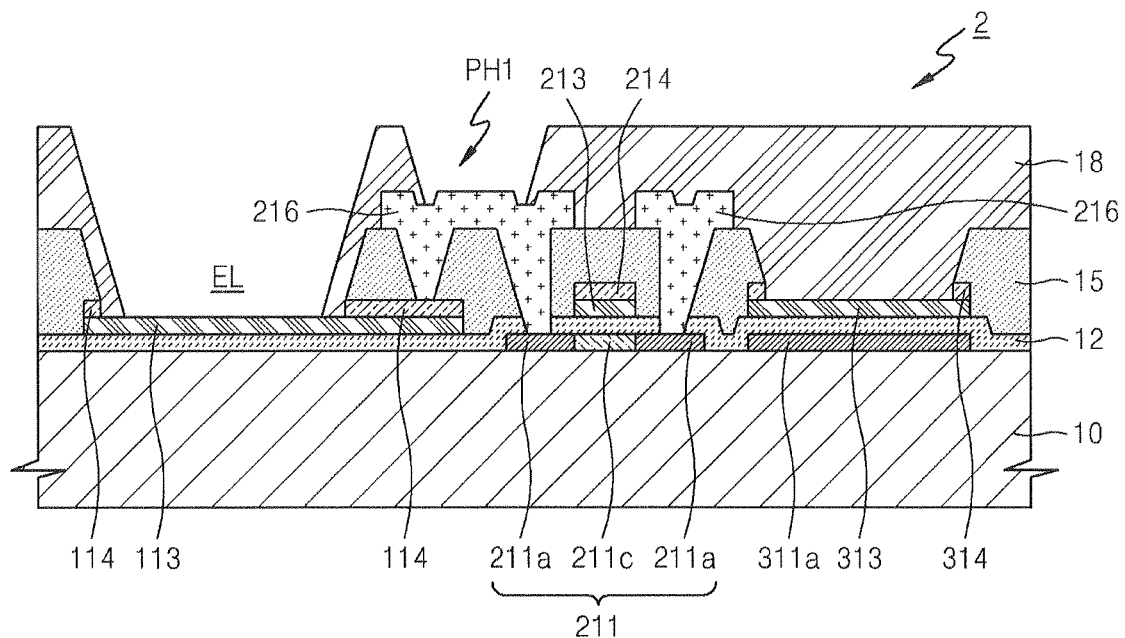
FIG. 3 is a schematic cross-sectional view of a portion of an organic light-emitting display apparatus according to a comparative example of the present invention.
Figure 4:
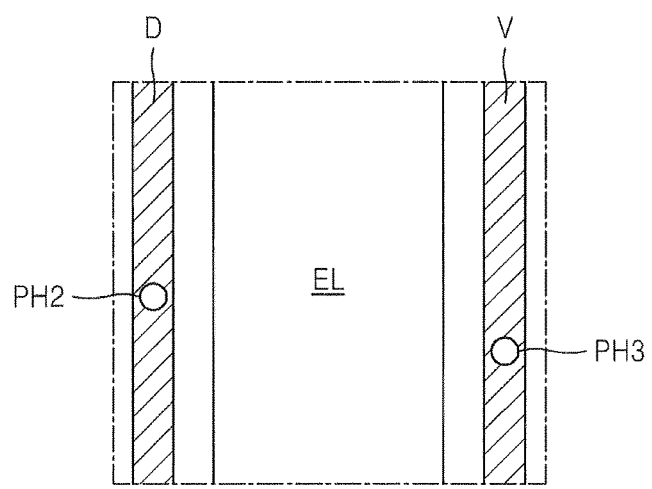
FIG. 4 is a schematic plan view of a portion of an organic light-emitting display apparatus according to a comparative example of the present invention.

FIG. 3 is a schematic cross-sectional view of a portion of an organic light-emitting display apparatus 2 according to a comparative example of the present invention. In FIG. 3, a case where a pinhole PH1 occurs in source and drain electrodes 216 is schematically depicted. FIG. 4 is a schematic plan view showing the occurrence of pinholes PH2 and PH3 respectively on a data line D and a power supply line V.

Referring to FIGS. 3 and 4, when a third insulating layer 18 is directly formed on the source and drain electrodes 216, the data line D, or the power supply line V without a passivation layer, if the pinholes PH1, PH2, and PH3 respectively occur in the third insulating layer 18, upper surfaces of the source and drain electrodes 216, the data line D, or the power supply line V may be exposed to the outside. In such a state, if the facing electrode 19, which is a common electrode, is formed on the third insulating layer 18, a short may occur between the facing electrode 19 and the source and drain electrodes 216, the data line D, and the power supply line V.

In the organic light-emitting display apparatus 1 according to the current embodiment of the present invention, since the passivation layer 217 is directly formed on upper surfaces of the source and drain electrodes 216 and the wirings formed on the same layer as the source and drain electrodes 216, although the pinholes described above occur, the upper surfaces of the source and drain electrodes 216 and the wirings formed on the same layer as the source and drain electrodes 216 are protected not to be directly exposed to the outside. Accordingly, a short between the facing electrode 19 and the source and drain electrodes 216 is prevented, and thus, can reduce product failure.

The passivation layer 217 may be formed of an inorganic insulating material such as SiO2, SiNx, SiON, Al2O3, TiO2, Ta2O5, HfO2, ZrO2, BST, and PZT, and may also be formed of an organic insulating material such as a widely used polymer such as poly(methyl methacrylate) (PMMA) and polystyrene (PS), a polymer derivative having a phenol group, an acrylic group polymer, an imide group polymer, an aryl ester group polymer, an amide group polymer, a fluoride group polymer, p-gilyrene group polymer, or a vinyl alcohol group polymer, and a blend of these polymers.

A method of manufacturing the organic light-emitting display apparatus 1, according to an embodiment of the present invention, will now be described with reference to FIGS. 5 through 11.

Figure 5:
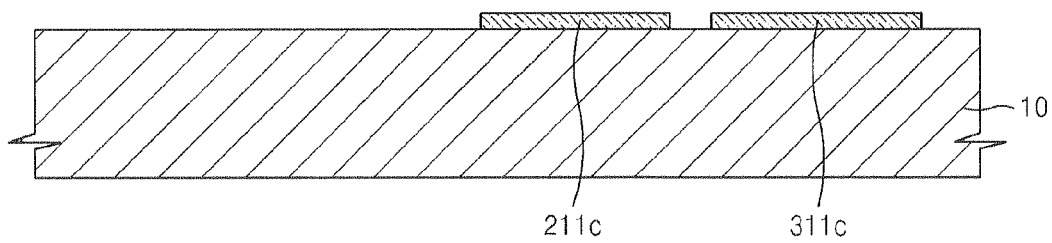
FIGS. 5 through 11 are schematic cross-sectional views showing a method of manufacturing the organic light-emitting display apparatus of FIG. 2, according to an embodiment of the present invention.

FIG. 5 is a schematic cross-sectional view showing the result of a first masking process of the method of manufacturing the organic light-emitting display apparatus 1, according to an embodiment of the present invention.

Referring to FIG. 5, an active layer 211c and the lower electrode 311c of the capacitor Cst are formed on the substrate 10.

Although not shown, a semiconductor layer (not shown) is deposited on the substrate 10 and a photoresist (not shown) is coated on the semiconductor layer (not shown). The active layer 211c of the second thin film transistor and the lower electrode 311c of the capacitor Cst are simultaneously formed by patterning the semiconductor layer (not shown) using a photolithography process in which a first photomask (not shown) is used.

The first mask process performed by a photolithography process is performed through a series of developing, etching, and stripping, or ashing after exposing the first photomask (not shown) using an exposure apparatus (not shown).

The semiconductor layer (not shown) may be formed of amorphous silicon or polysilicon. The polysilicon may be formed by crystallizing the amorphous silicon. The amorphous silicon may be crystallized by various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

Figure 6:
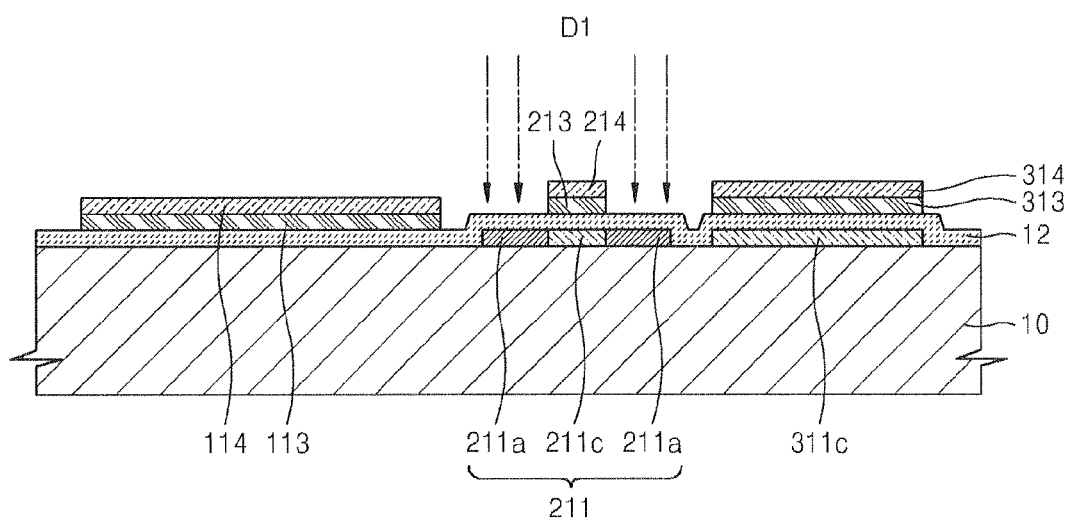

FIG. 6 is a schematic cross-sectional view showing a second mask process of the method of manufacturing the organic light-emitting display apparatus 1, according to an embodiment of the present invention.

Referring to FIG. 6, the first insulating layer 12 is formed on the resultant structure of the first mask process of FIG. 5, and the first pixel electrode 113 and the second pixel electrode 114 of the pixel unit PXL, the first gate electrode 213 and the second gate electrode 214 of the second thin film transistor TR2, and the first upper electrode 313 and the second upper electrode 314 of the capacitor Cst are sequentially formed on the first insulating layer 12.

The first gate electrode 213, the first pixel electrode 113, and the first upper electrode 313 of the capacitor Cst are simultaneously formed as the same layer, and may be formed of the same transparent conductive material selected from the group consisting of ITO, IZO, ZnO, and $In_2O_3$.

The second gate electrode 214, the second pixel electrode 114, and the second upper electrode 314 of the capacitor Cst are simultaneously formed as the same layer, and may be formed of at least a material selected from the group consisting of Ti, Mo, Al, Ag, Cu, and an alloy of these materials.

The resultant structure is doped with an ion dopant D1. As described above, the ion dopant D1 may be ions of Group III or Group V elements, and the active layer 211 of the second thin film transistor TR2, as a target, may be doped with the ion dopant D1 at a concentration of $1 \times 10^{15}$ atoms/cm$^2$ or above.

At this point, as a result of doping of the active layer 211 with the ion dopant D1 by using the first and second gate electrodes 213 and 214 of the second thin film transistor TR2 as a self-aligning mask, the active layer 211 includes the source and drain regions 211a doped with the ion dopant D1 and the channel region 211c between the source and drain regions 211a. That is, the source and drain regions 211a can be formed by using the first and second gate electrodes 213 and 214 of the second thin film transistor TR2 as a self-aligning mask without needing an additional photomask.

Figure 7:
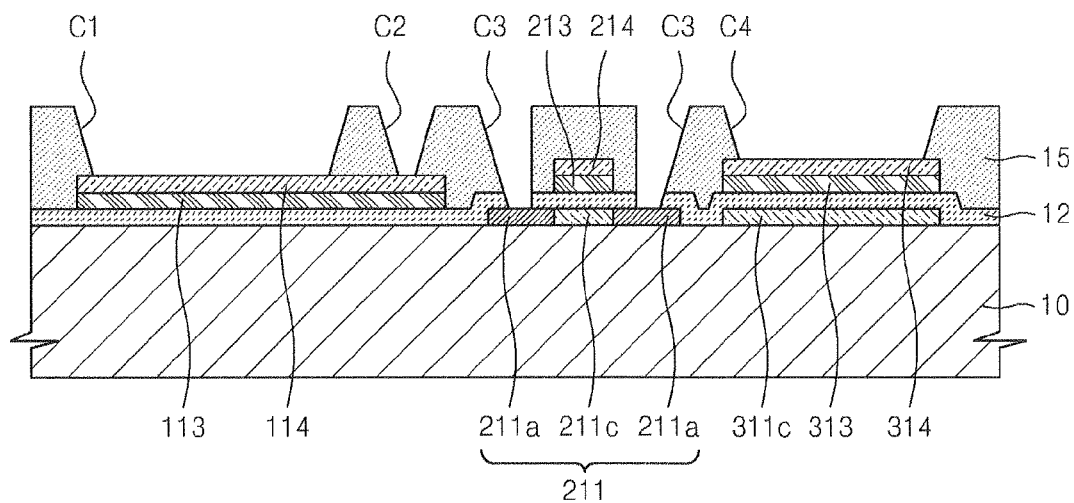

FIG. 7 is a schematic cross-sectional view showing the result of a third mask process of the method of manufacturing the organic light-emitting display apparatus 1, according to an embodiment of the present invention.

Referring to FIG. 7, the second insulating layer 15 is stacked on the resultant structure of the second mask process of FIG. 6. Afterwards, a first contact hole C1 that exposes an upper surface of the second pixel electrode 114 of the pixel unit PXL by patterning the second insulating layer 15, a second contact hole C2 that exposes a portion of the second pixel electrode 114 to connect the first pixel electrode 113 and the second pixel electrode 114 to one of the source and drain electrodes 216, a third contact hole C3 that exposes a portion of the source and drain regions 211a of the active layer 211, and a fourth contact hole C4 that exposes a portion of the second upper electrode 314 of the capacitor Cst are formed in the second insulating layer 15.

Figure 8:
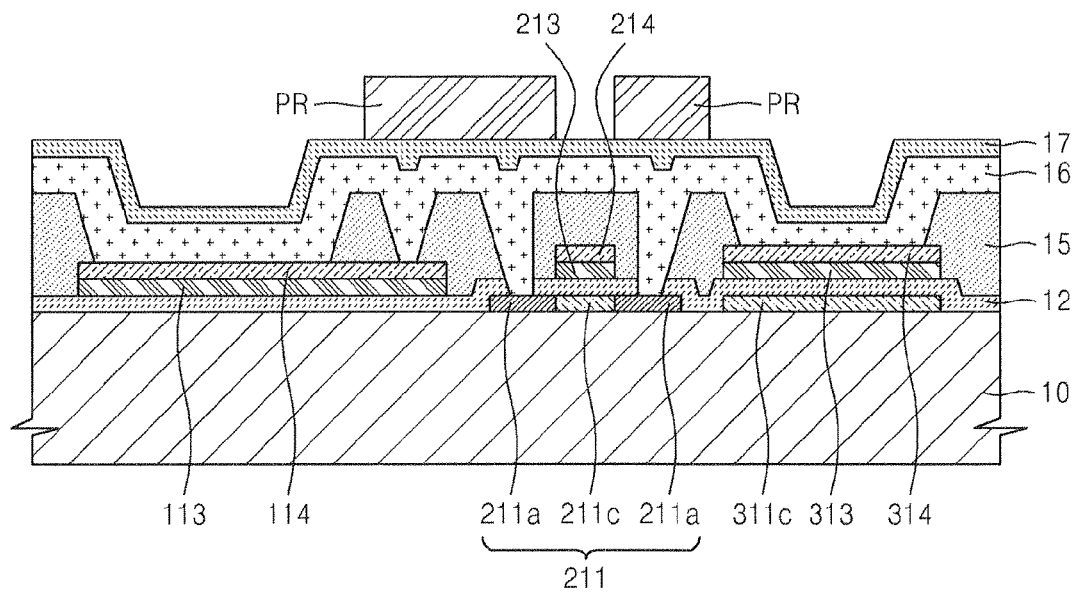

FIG. 8 is a schematic cross-sectional view showing the result of a fourth mask process of the method of manufacturing the organic light-emitting display apparatus 1, according to an embodiment of the present invention.

Referring to FIG. 8, a metal layer 16 that is a material for the source and drain electrodes 216 and an insulating layer 17 that is a material for the passivation layer 217 are sequentially formed on the resultant structure of the third mask process of FIG. 7.

Although not shown in detail, a photoresist PR is patterned using a fourth photomask (not shown) so that a region of the photoresist PR corresponding to the source and drain electrodes 216 remains on the insulating layer 17 that is a material for the passivation layer 217. The insulating layer 17 that is a material for the passivation layer 217 is patterned using the remaining photoresist PR as a mask. The patterning of the insulating layer 17 may be performed by using a dry etching process.

Figure 9:
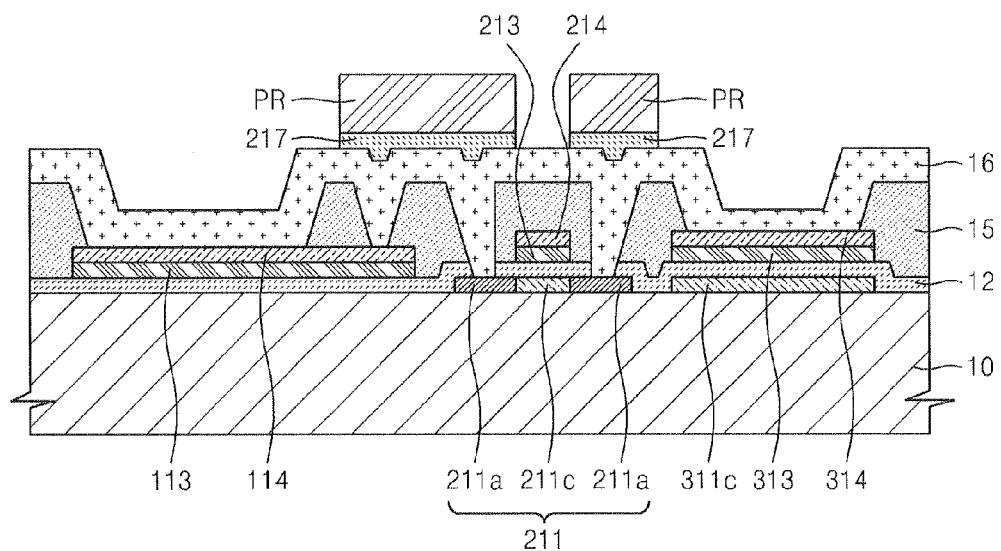

FIG. 9 is a schematic cross-sectional view showing the result of etching of the insulating layer 17 that is a material for the passivation layer 217 of FIG. 8.

Referring to FIG. 9, the passivation layer 217 is formed under the remaining photoresist PR.

Although not shown in detail, the metal layer 16 that is a material for the source and drain electrodes 216 is patterned using the patterned photoresist PR and the passivation layer 217 as a mask. The patterning of the metal layer 16 may be performed by a first wet etching process.

FIG. 9 is a schematic cross-sectional view showing the result of etching of the metal layer 16 that is a material for the source and drain electrodes 216.

Figure 10:
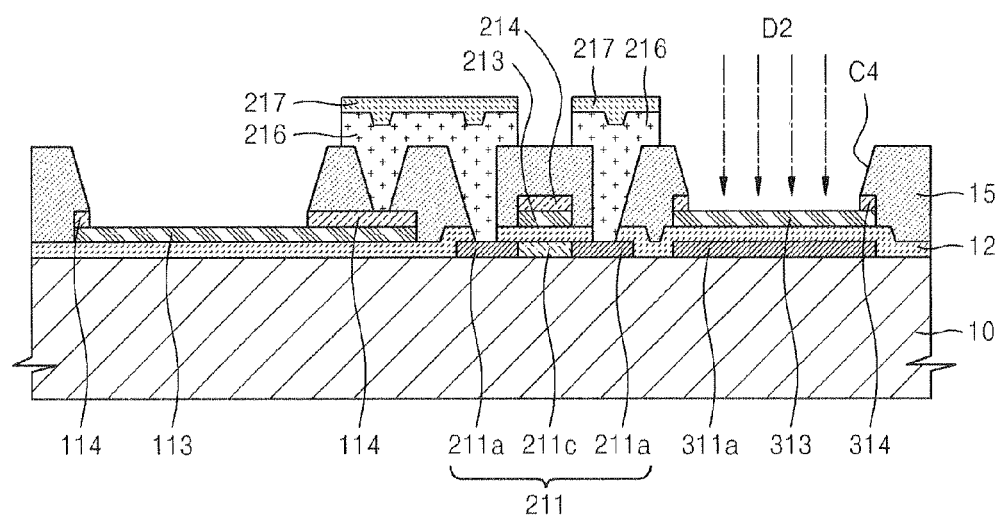

Referring to FIG. 10, the source and drain electrodes 216 are formed under the passivation layer 217. Also, portions of the second pixel electrode 114 of the pixel unit PXL and the second upper electrode 314 of the capacitor Cst are removed. The foregoing patterning may be performed by a second wet etching process.

As described above, in the fourth mask process, the passivation layer 217 may further be formed through a single dry etching and two wet etchings without an additional photomask process. Accordingly, a short between the source and drain electrodes 216 and the facing electrode 19 through pinholes can be prevented, thereby reducing the product failure rate and reducing process costs.

In the current embodiment described above, two wet etching processes are separately performed because the material of the second pixel electrode 114 of the pixel unit PXL and the second upper electrode 314 of the capacitor Cst in the first etching process is different from the material of the source and drain electrodes 216 in the second etching process. If the material for forming the second pixel electrode 114 of the pixel unit PXL and the second upper electrode 314 of the capacitor Cst is the same as the material for forming the source and drain electrodes 216, a single wet process may be performed.

After the fourth mask process, the resultant structure described above is doped with an ion dopant D2. As described above, the ion dopant may be ions of Group III or Group V elements, and may be doped at a concentration of $1 \times 10^{15}$ atoms/cm$^2$ or above using the lower electrode 311a of the capacitor Cst as a target. As a result, the lower electrode 311a and the first upper electrode 313 of the capacitor Cst form a MIM CAP structure, and thus, the margin for designing a voltage can be increased when a circuit is designed.

Figure 11:
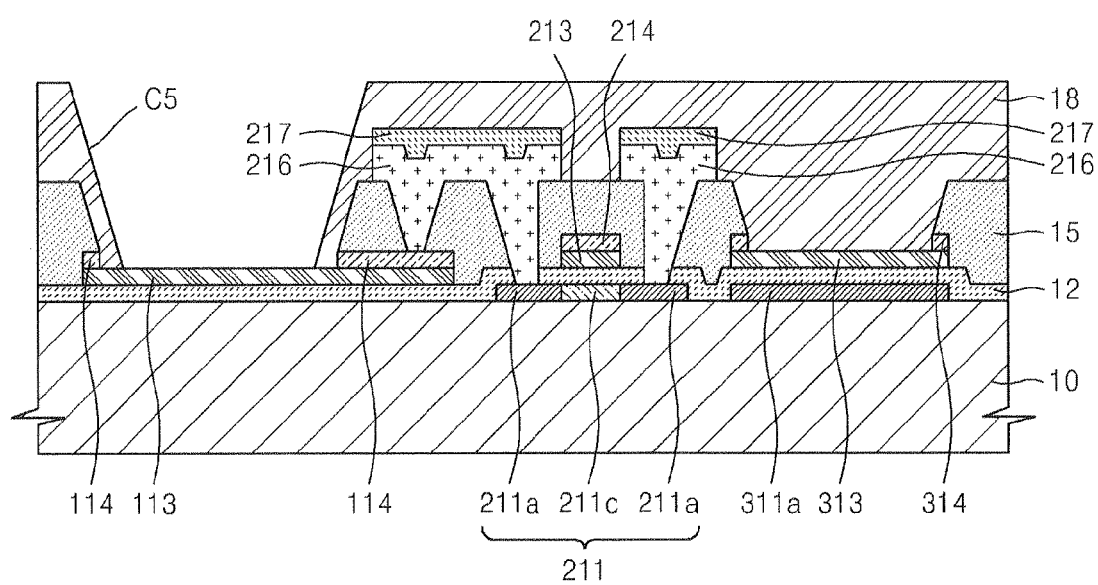

FIG. 11 is a schematic cross-sectional view showing the result of a fifth mask process of the method of manufacturing the organic light-emitting display apparatus 1, according to an embodiment of the present invention.

Referring to FIG. 11, the third insulating layer 18 is formed on the resultant structure of the fourth mask process of FIG. 10, and an opening C5 that exposes an upper surface of the first pixel electrode 113 of the pixel unit PXL is formed.

The light-emitting layer 118 described above is in the opening C5, and thus, the light-emitting layer 118 emits light according to the application of voltage to the first pixel electrode 113 and the facing electrode 19 (refer to FIG. 2).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a thin film transistor comprising an active layer, a gate electrode, and source and drain electrodes electrically connected to the active layer, the gate electrode comprising a first gate electrode disposed on the active layer and a second gate electrode formed on the first gate electrode;
a pixel electrode formed on the same layer as the first gate electrode;
a light-emitting layer formed on the pixel electrode;
a passivation layer formed on upper surfaces of the source and drain electrodes and formed on an upper surface of a wiring that is formed on the same layer as the source and drain electrodes;
an organic insulating layer that is formed on the passivation layer and covers the thin film transistor, the organic insulating layer comprising an opening that exposes an upper surface of the pixel electrode, the organic insulating layer directly contacting the passivation layer;
a lower electrode formed on the same layer as the active layer;
an upper electrode disposed on the lower electrode and formed on the same layer as the first gate electrode, the lower electrode and the upper electrode forming a capacitor, the organic insulating layer directly contacting the upper electrode; and
a facing electrode that is formed on the light-emitting layer, and is formed to directly contact the organic insulating layer to face the pixel electrode.

2. The organic light-emitting display apparatus of claim 1, wherein an edge side of the passivation layer has the same etching surface as edge sides of the source and drain electrodes and an edge side of the wiring.

3. The organic light-emitting display apparatus of claim 2, wherein the organic insulating layer directly contacts the edge side of the passivation layer.

4. The organic light-emitting display apparatus of claim 1, wherein the passivation layer comprises an inorganic insulating material.

5. The organic light-emitting display apparatus of claim 1, wherein the passivation layer comprises an organic insulating material.

6. The organic light-emitting display apparatus of claim 1, wherein the wiring is a data line.

7. The organic light-emitting display apparatus of claim 1, wherein the wiring is a power supply line.

8. The organic light-emitting display apparatus of claim 1, further comprising:
a first insulating layer disposed between the active layer and the gate electrode; and a second insulating layer formed between the gate electrode and the source and drain electrodes, wherein one of the source and drain electrodes is connected to the pixel electrode through a contact hole formed in the second insulating layer.

9. The organic light-emitting display apparatus of claim 1, wherein the gate electrode includes a transparent conductive material, and the pixel electrode includes the transparent conductive material of the gate electrode.

10. The organic light-emitting display apparatus of claim 1, wherein the facing electrode is a reflection electrode.

11. The organic light-emitting display apparatus of claim 1, wherein the lower electrode comprises a semiconductor doped with an ion dopant.

12. The organic light-emitting display apparatus of claim 1, wherein the first gate electrode includes a transparent conductive material, and the upper electrode includes the transparent conductive material of the first gate electrode.

13. The organic light-emitting display apparatus of claim 12, wherein the transparent conductive material of the first gate electrode is at least one selected from the group consisting of ITO, IZO, ZnO, and $In_2O_3$.

14. A method of manufacturing an organic light-emitting display apparatus, the method comprising:

performing a first mask process for forming an active layer of a thin film transistor and for forming a lower electrode of a capacitor, the lower electrode formed on the same layer as the active layer;

performing a second mask process for forming a first insulating layer on the resultant structure of the first mask process, for forming a first gate electrode of the thin film transistor, an upper electrode of the capacitor and a pixel electrode of a pixel unit by patterning a transparent conductive material layer, and for forming a second gate electrode of the thin film transistor by patterning a first metal layer after sequentially forming the transparent conductive material layer and the first metal layer on the first insulating layer, a gate electrode of the thin film transistor comprising the first gate electrode disposed on the active layer and the second gate electrode formed on the first gate electrode, the pixel electrode formed on the same layer as the first gate electrode, the upper electrode disposed on the lower electrode and formed on the same layer as the first gate electrode, the lower electrode and the upper electrode forming the capacitor;

performing a third mask process for forming a second insulating layer on the resultant structure of the second mask process, and for forming contact holes that expose source and drain regions of the active layer and the pixel electrode;

performing a fourth mask process for sequentially forming a second metal layer and a passivation layer on the resultant structure of the third mask process, and for forming source and drain electrodes connected to the active layer and a wiring formed on the same layer as the source and drain electrodes by patterning the second metal layer and the passivation layer, the thin film transistor comprising the active layer, the gate electrode, and the source and drain electrodes electrically connected to the active layer, the passivation layer formed on upper surfaces of the source and drain electrodes and formed on an upper surface of the wiring that is formed on the same layer as the source and drain electrodes;

performing a fifth mask process for forming an organic insulating layer on the resultant structure of the fourth mask process, and for forming an opening on the organic insulating layer to expose the pixel electrode, the organic insulating layer being formed on the passivation layer and covering the thin film transistor, the organic insulating layer comprising the opening that exposes an upper surface of the pixel electrode, the organic insulating layer directly contacting the passivation layer, the organic insulating layer directly contacting the upper electrode; and sequentially forming a light-emitting layer and a facing electrode on the pixel electrode after performing the fifth mask process, the light-emitting layer formed on the pixel electrode, the facing electrode being formed on the light-emitting layer, and being formed to directly contact the organic insulating layer to face the pixel electrode.

15. The method of claim 14, further comprising doping the source and drain regions with an ion dopant after performing the second mask process.

16. The method of claim 14, wherein the fourth mask process comprises:

a first etching process for removing a portion of the passivation layer;

a second etching process for removing the second metal layer stacked on the pixel electrode; and a third etching process for removing the first metal layer formed on the transparent conductive material layer of the pixel electrode.

17. The method of claim 16, wherein the first etching process is a dry etching process.

18. The method of claim 14, further comprising doping the lower electrode of the capacitor with an ion dopant after performing the fourth mask process.

* * * * *